US008785326B2

(12) United States Patent
Schubert et al.

(10) Patent No.: US 8,785,326 B2
(45) Date of Patent: Jul. 22, 2014

(54) METHODS OF SEPARATING SOLID STATE TRANSDUCERS FROM SUBSTRATES AND ASSOCIATED DEVICES AND SYSTEMS

(75) Inventors: Martin F. Schubert, Boise, ID (US); Ming Zhang, Boise, ID (US); Lifang Xu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 13/482,856

(22) Filed: May 29, 2012

(65) Prior Publication Data
US 2013/0320386 A1 Dec. 5, 2013

(51) Int. Cl.
*H01L 21/311* (2006.01)

(52) U.S. Cl.
USPC ........... 438/700; 438/378; 438/380; 438/706; 438/745; 257/E21.006; 257/E21.027; 257/E21.053; 257/E21.126; 257/E21.127; 257/E21.134; 257/E21.17; 257/E21.227; 257/E21.229; 257/E21.352; 257/E21.475; 257/E21.548

(58) Field of Classification Search
USPC ............. 438/55, 91, 141, 378, 380, 700, 706, 438/745, 795; 257/E21.006, E21.027, 257/E21.053, E21.126, E21.127, E21.134, 257/E21.17, E21.227, E21.229, E21.352, 257/E21.475, E21.548
See application file for complete search history.

(56) References Cited

U.S. PATENT DOCUMENTS

| 5,907,151 A * | 5/1999 | Gramann et al. .......... 250/214.1 |
| 6,617,261 B2 | 9/2003 | Wong et al. |
| 7,687,810 B2 | 3/2010 | Mo et al. |
| 7,842,547 B2 * | 11/2010 | Shelton et al. ................ 438/108 |
| 8,030,102 B2 * | 10/2011 | Lai .................................... 438/22 |
| 8,517,550 B2 * | 8/2013 | Ramer et al. .................... 362/84 |
| 2010/0055873 A1 | 3/2010 | Yan et al. |
| 2011/0128718 A1 | 6/2011 | Ramer et al. |

OTHER PUBLICATIONS

Lin, C.-F. et al., "Chemical Lift-Off Process for Blue Light-Emitting Diodes," Applied Physics Express 3 (2010), 092101, 3 pages, DOI: 10.1143/APEX.3.092101.
Liu, H.F. et al., "Epitaxial Growth and Chemical Lift-Off of GaIn/GaN Heterostructures on c- and r-Sapphire Substrates Employing ZnO Sacrificial Templates," J. Vac. Sci Technol. A 28(4), Jul./Aug. 2010, pp. 590-594, DOI: 10.1116/1.3443220.

* cited by examiner

*Primary Examiner* — David Nhu
(74) *Attorney, Agent, or Firm* — Perkins Coie LLP

(57) ABSTRACT

Wafer-level processing of wafer assemblies with transducers is described herein. A method in accordance with some embodiments includes forming a solid state transducer device by forming one or more trenches to define solid state radiation transducers. An etching media is delivered in to the trenches to release the transducers from a growth substrate used to fabricate the transducers. A pad can hold the radiation transducers and promote distribution of the etching media through the trenches to underetch and release the transducers.

30 Claims, 13 Drawing Sheets

# METHODS OF SEPARATING SOLID STATE TRANSDUCERS FROM SUBSTRATES AND ASSOCIATED DEVICES AND SYSTEMS

TECHNICAL FIELD

The present technology is related to methods of manufacturing solid state transducers and associated solid state transducer devices and systems. In particular, the present technology relates to methods of manufacturing involving separating solid state transducers from a substrate.

BACKGROUND

Semiconductor layers are often grown on substrates to make solid state transducers, such as light-emitting diodes ("LEDs"), by epitaxially growing materials on sapphire or other types of substrates. Lasers, chemical etchants, or grinders are generally used to remove sapphire substrates from the epitaxial layers. Lasers can deliver photon energy through the sapphire substrates to heat and decompose (e.g., melt) epitaxial material at the epitaxial/substrate interfaces to separate the epitaxial layers from the substrates. Unfortunately, rapid heating and cooling of the epitaxial material associated with laser lift off processes can damage one or more of the epitaxial layers. The damage can include cracking (e.g., crack initiation, crack growth, etc.) and often results in crack propagation across the entire wafer assembly.

Conventional chemical etching lift off processes often involve exposing the edge of a wafer assembly to a chemical etchant such that the chemical etchant travels toward the center of the wafer assembly through voids formed by a reaction between an epitaxial layer and a growth wafer. To lift the entire epitaxial layer from the wafer, the chemical etchant must reach the center of the wafer assembly, which often leads to relatively long etch times. For example, the chemical etchant must travel four inches radially inward along the epitaxial/wafer interface to reach the center of an eight inch diameter wafer assembly. Additionally, it is difficult to consistently deliver the chemical etchant through the voids along the entire epitaxial/wafer interface. Grinding processes are often used to mechanically remove substrates from the epitaxial layers as an alternative to chemical etching. Unfortunately, mechanical grinding can damage the epitaxial layer and produce relatively large scratches which are removed by a subsequent polishing process.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure.

DETAILED DESCRIPTION

Lighting systems can include light sources in the form of solid state transducers. The term "solid state transducer" ("SST") generally refers to solid state components that convert electrical energy into electromagnetic radiation or conversely convert electromagnetic radiation into electrical energy. The term "solid state radiation transducer" ("SSRT") generally refers to solid state devices (e.g., LEDs) that include a material (e.g., semiconductor material) as the active medium to convert electrical energy into electromagnetic radiation in the visible, ultraviolet, or infrared spectra. Additionally, depending on the context in which it is used, the term "substrate" can refer to a wafer-level substrate (e.g., a growth substrate) or to a singulated, die-level substrate. A person skilled in the relevant art will understand that the present technology may have additional embodiments and that the present technology may be practiced without several of the details of the embodiments described below with reference to FIGS. 1A-10.

Figure 1A:
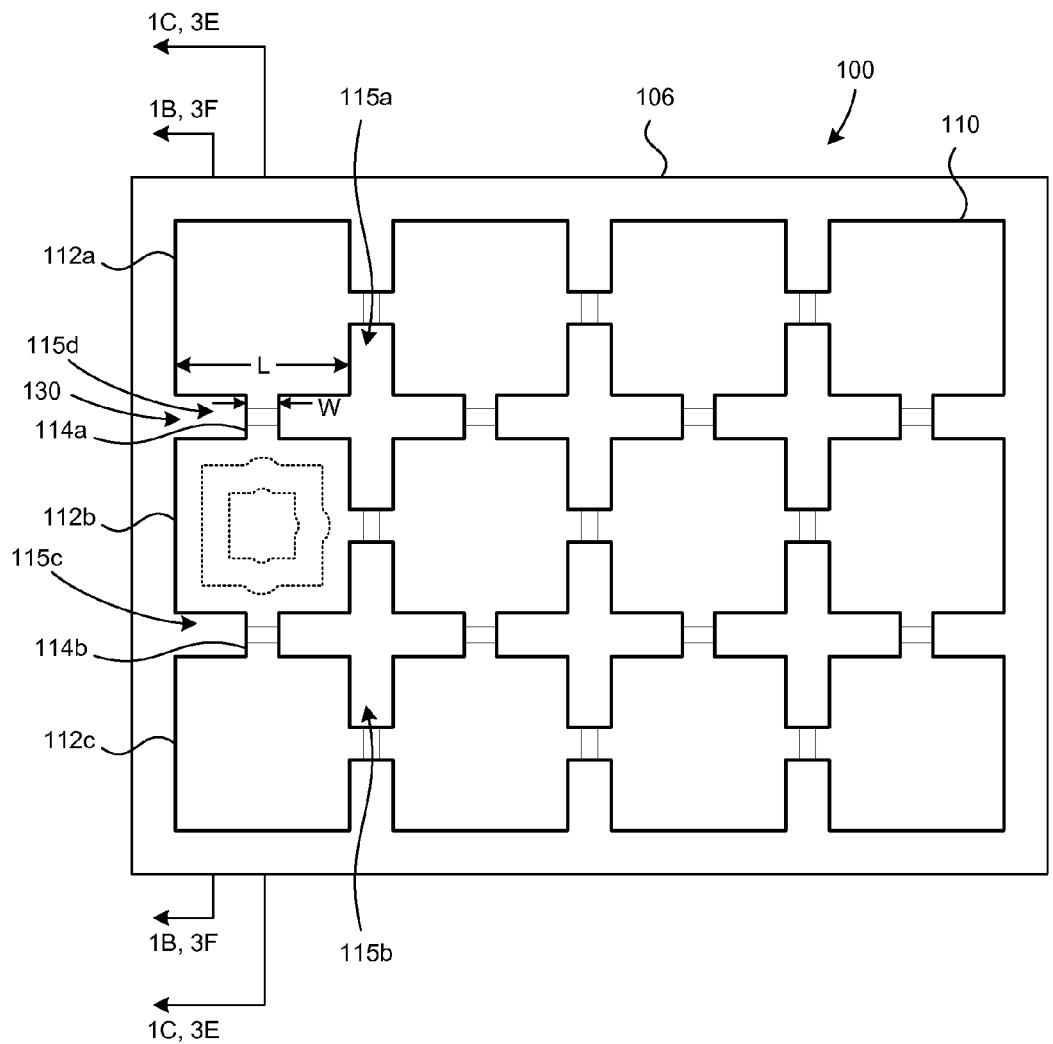
FIG. 1A is a schematic top plan view of a portion of a wafer-level assembly in accordance with an embodiment of the present technology.

FIG. 1A is a schematic top plan view of a portion of a wafer-level assembly 100 ("assembly 100") that can include a transducer structure 106 and a transducer support member 110. The support member 110 can include pads 112a, 112b, 112c (collectively "112") and links 114a, 114b (collectively "114") connecting the pads 112 together. The pads 112 and links 114 define openings 115a, 115b (collectively "115").

Figure 1B:
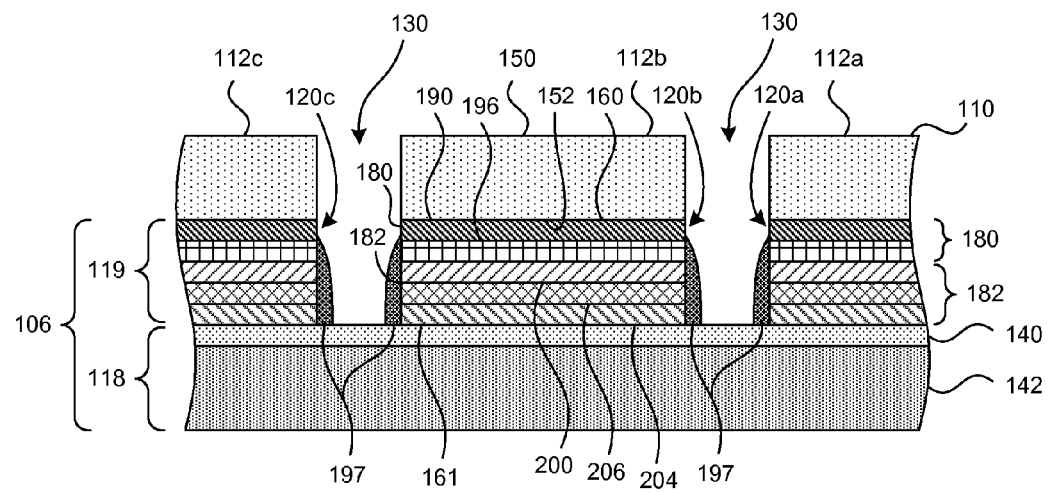
FIG. 1B is a schematic cross-sectional view of the wafer-level assembly taken along a line 1B-1B of FIG. 1A in accordance with an embodiment of the present technology.
Figure 1C:
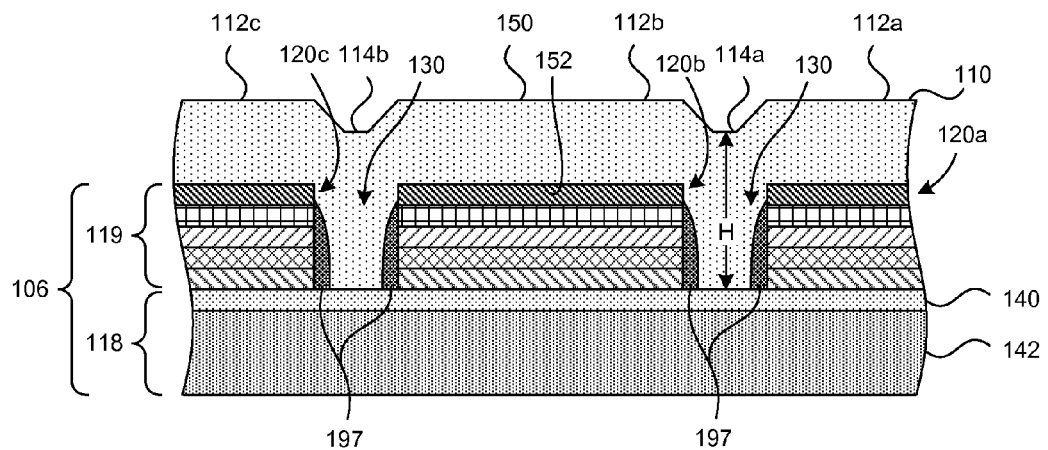
FIG. 1C is a schematic cross-sectional view of the wafer-level assembly taken along a line 1C-1C of FIG. 1A in accordance with an embodiment of the present technology.

FIGS. 1B and 1C are schematic cross-sectional views of various stages of a solid state transducer manufacturing process. Generally, the transducer structure 106 can include a growth substrate 118 and a multilayer structure 119. The multilayer structure 119 can include solid state radiation transducers 120a, 120b, 120c (collectively "120") positioned between the growth substrate 118 and the pads 112a, 112b, 112c, respectively. The growth substrate 118 can include a sacrificial material 140 and a base 142. The support member 110 allows etching media to be generally distributed throughout a network of trenches to underetch all of the transducers 120 from areas adjacent the sides of the transducers 120. The entire sacrificial material 140 can be removed to separate substantially all of the transducers 120 from the base 142.

The description of one of the pads 112 applies equally to the other pads 112 unless the context clearly dictates otherwise. Referring to FIG. 1B, the pad 112b can include a first surface 150 and a second surface 152 opposite the first surface 150, and the pad 112b can have a shape that generally matches the shape of the transducer 120b. In some embodiments, including the illustrated embodiment of FIG. 1A, the pad 112b and the transducer 120b have generally square shapes as viewed from above. The pad 112b and the transducer 120b in alternative embodiments can have other polygonal shapes (e.g., rectangular shapes), circular shapes, elliptical shapes, or the like.

The transducer 120b of FIG. 1B can have a first surface 160 coupled to the second surface 152 of the pad 112b and a second surface 161 coupled to the sacrificial material 140. The transducer 120b includes circuitry 180 and a transducer element 182. The circuitry 180 can include insulating material 190 and a conducting material 196. The insulating material 190 can include, without limitation, a dielectric material (e.g., silicon dioxide, silicon nitride, combinations thereof, etc.) and can isolate the conducting material 196 from the pad 112b. The conducting material 196 can include, without limitation, copper, aluminum, conductive polymers, combinations thereof, or the like. Additionally or alternatively, the conducting material 196 can serve as a contact and can be made, in whole or in part, of a material that can reflect radiation emissions. For example, the conducting material 196 can be made of silver or other suitable reflective material.

The transducer element 182 of FIG. 1B can include a first semiconductor material 200, a second semiconductor material 204, and an active region 206 between the first semiconductor material 200 and the second semiconductor material 204. The first semiconductor material 200 can be a P-type semiconductor material (e.g., P-type gallium nitride), and the second semiconductor material 204 can be an N-type semiconductor material (e.g., N-type gallium nitride). In other embodiments, the first and second semiconductor materials 200, 204 can be reversed. The active region 206 can include a single quantum well, multiple quantum wells, and/or a single-grain semiconductor material, e.g., indium gallium nitride. In other embodiments, the transducer element 182 can include other suitable semiconductor materials, such as gallium arsenide, aluminum gallium arsenide, gallium arsenide phosphide, combinations thereof, or the like. The transducer element 182 can be an LED or other type of SSRT.

The transducers 120 are separated by boundaries defined by interconnected trenches 130. One trench 130 is positioned between the transducers 120a, 120b. Another trench 130 is positioned between the transducers 120b, 120c. The shapes, dimensions, and relative positions of the trenches 130 can be selected to achieve the desired distribution of flowable media (e.g., a flowable etchant). In some embodiments, a network of interconnected trenches 130 can extend across most of the growth substrate 118. In one embodiment, the network of trenches 130 extends between diametrically opposite edges of the growth substrate 118.

As shown in FIGS. 1A and 1C, the link 114a can be in a trench 130 and can physically couple the pads 112a, 112b together. Insulating material 197 (FIG. 1C) can form spacers that insulate the transducers 120 from the links 114. A width W (FIG. 1A) of the link 114a can be substantially less than a length L (FIG. 1A) of a portion of the trench 130 between the transducers 120a, 120b. The height H (FIG. 1C) of the link 114a can be equal to or greater than the depth of the trench 130. In other embodiments, the height H of the link 114a is less than the depth of the trench 130. Insulating material 197 can form spacers that insulate the links 114.

Figure 2:
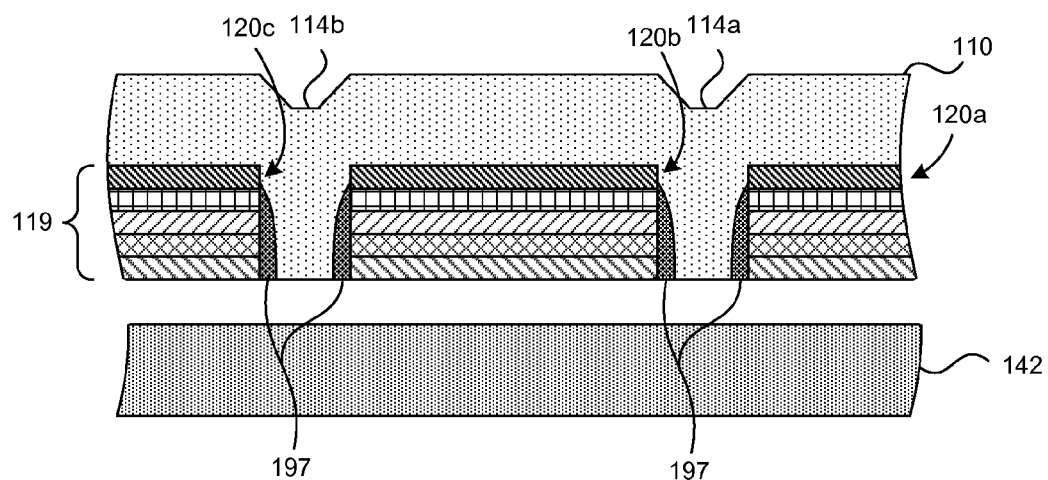
FIG. 2 is a schematic cross-sectional view of solid state transducers spaced apart from a growth substrate in accordance with an embodiment of the present technology.

FIG. 2 shows the base 142 after etching the sacrificial material 140 and separating the base 142 from the transducers 120 while the transducers 120 are held by the support member 110. The support member 110 can be used to conveniently handle the released transducers 120 before, during, and/or after subsequent processing.

FIGS. 3A-3G show various stages in a method of manufacturing solid state transducer devices in accordance with an embodiment of the present technology. Generally, the multilayer structure 119 (FIGS. 3C-3E) is formed on the growth substrate 118. The trenches 130 are formed through at least a portion of the multilayer structure 119 to define the individual transducers 120. The support member 110 is subsequently formed on the transducers 120, and the transducers 120 are then released from the base 142.

Figure 3A:
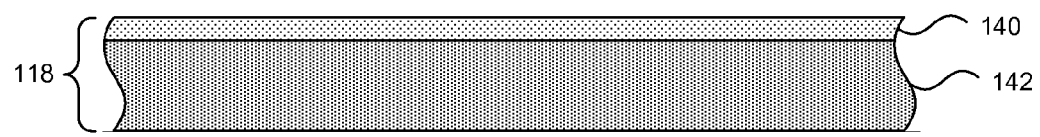
FIGS. 3A-3G are schematic cross-sectional views illustrating various stages in a method of manufacturing solid state transducers in accordance with an embodiment of the present technology.

FIG. 3A is a schematic cross-sectional view of the growth substrate 118 that can include materials having suitable properties to facilitate forming additional structures. The additional structures can include, without limitation, one or more seed materials, insulating material, barrier materials, masks, or the like. In various embodiments, the growth substrate 118 can include, without limitation, polycrystalline aluminum nitride, aluminum oxide, nitride, or the like. In one embodiment, the growth substrate 118 is made of silicon (e.g., polysilicon, single crystal silicon, etc.). For example, the base 142 can be a silicon wafer. The sacrificial material 140 can be a silicon dioxide material grown on the base 142. In other embodiments, the sacrificial material 140 can be made of nitride (including silicon nitride), phosphosilicate glass, or the like.

Figure 3B:
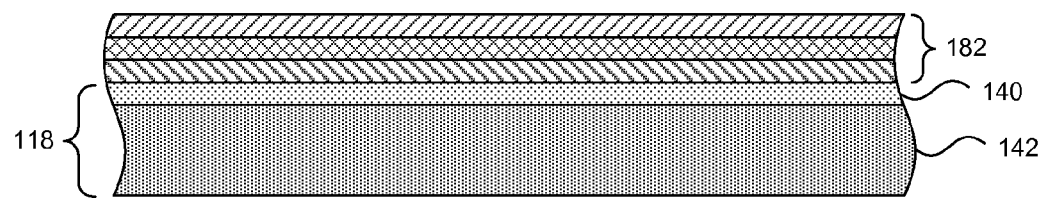
Figure 3C:
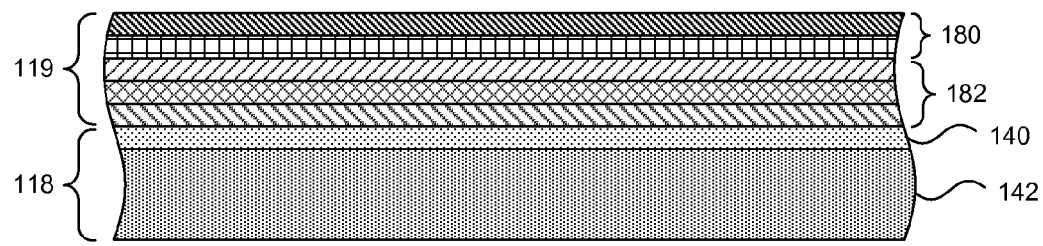

FIGS. 3B and 3C show manufacturing stages subsequent to that shown in FIG. 3A. FIG. 3B shows a stage after the transducer element 182 has been formed by, for example, metal organic chemical vapor deposition, molecular beam epitaxy, liquid phase epitaxy, hydride vapor phase epitaxy, combinations thereof, or other suitable formation processes. FIG. 3C shows a stage after the circuitry 180 has been formed on the transducer element 182. The circuitry 180 can be formed using chemical vapor deposition processing, sputtering techniques, oxidation processes, photolithography, or other suitable formation processes and can include, without limitation, reflective layers, conductive layers, insulating layers, runners, vias, transparent layers, or the like. Reflective layers can be made, in whole or in part, of a reflective material (e.g., titanium, nickel, silver, aluminum, gold, combinations thereof, or the like). The configuration and materials of the circuitry 180 can be selected based on, for example, the structure of the transducer element 182.

Figure 3D:
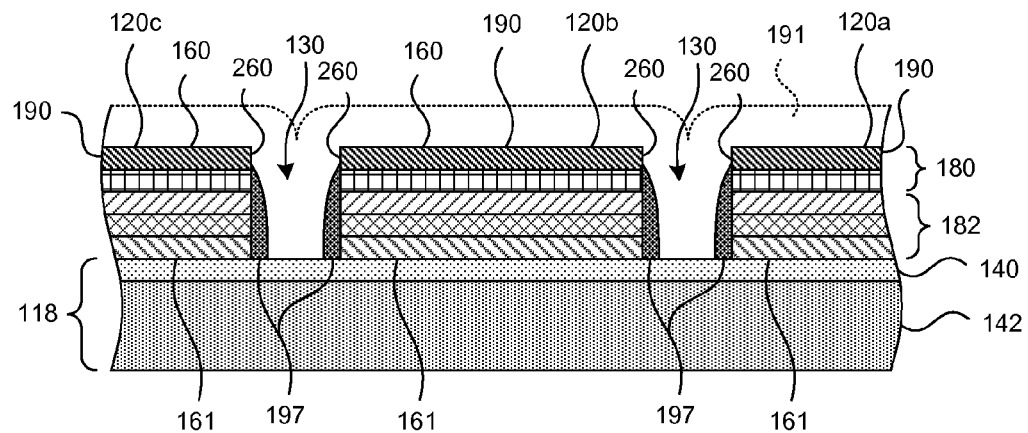

FIG. 3D shows a stage after forming the trenches 130 that extend through the multilayer structure 119 to the sacrificial material 140. The trenches 130 can have generally rectangular shaped cross sections with generally parallel sidewalls 260. In other embodiments, the trenches 130 can have substantially U-shaped cross sections, V-shaped cross sections, or other types of cross sections suitable for exposing at least a portion of the sacrificial material 140. The trenches 130 can be produced by methods known in the art, for example by forming a mask over the areas above the transducers 120 and etching (e.g., wet etching, dry etching, etc.) through the exposed portions of the multilayer structure 119.

After forming the trenches 130, a dielectric material 191 (shown in dashed line) can be grown on the transducers 120 and can fill the trenches 130. An anisotropic etching process can remove dielectric material 191 from the surfaces 160 of the transducers 120 leaving the dielectric material 197 located along the sidewalls 260. The insulating material 197 can extend from the insulating material 190 to the sacrificial material 140.

Figure 3E:
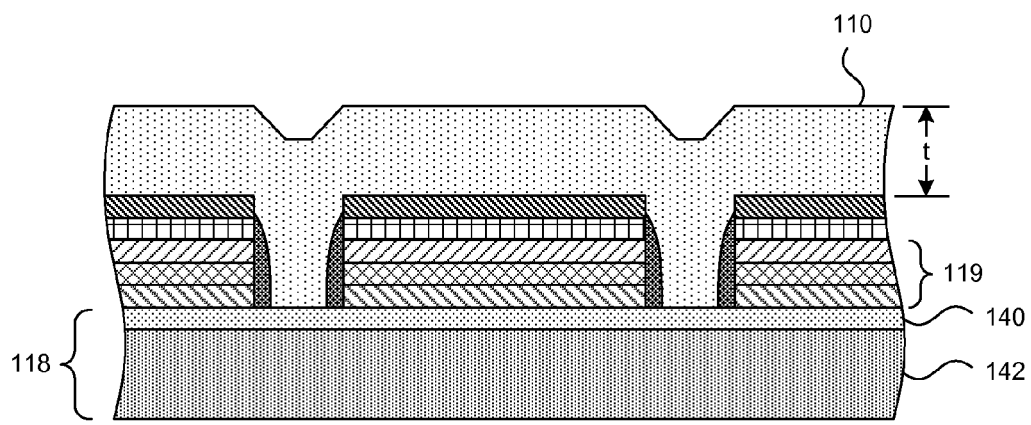

FIG. 3E shows a stage of processing after the support member 110 has been formed. In one embodiment, a seed material can be formed on the transducers 120 and the growth substrate 118 and then patterned. A bulk material can then be applied to the patterned seed material to form the support member 110. For example, an upper seed material can be deposited using a vapor deposition process and patterned to remove the seed material where the openings 115 (FIG. 1A) are to be located between transducers 120. A bulk copper can then be plated onto the remaining portions of the seed material to form the holders 112 and the links 114. In some embodiments, an etch resistant material (e.g., aluminum, copper, etc.) is applied to the patterned seed material. The thickness t of the support member 110 can be, for example, about 30 μm to about 100 μm. In other embodiments, a bulk material having the thickness t is formed on the transducers 120 and the growth substrate 118, and a mask and etch process is used to remove portions of such a bulk material to form the openings 115 (FIG. 1A) in the support member 110. In other embodiments, the support member 110 can have a multilayer construction and can be made of different materials.

The illustrated portion of the support member 110 of FIG. 1A has twelve pads 112 and seventeen links 114 interconnecting the twelve pads 112. Some of the pads 112 and links 114 are not labeled to avoid obscuring the drawing. The number, shapes, and dimensions of the pads 112 and the links 114 can be selected based on, for example, subsequent processes to be performed.

Figure 3F:
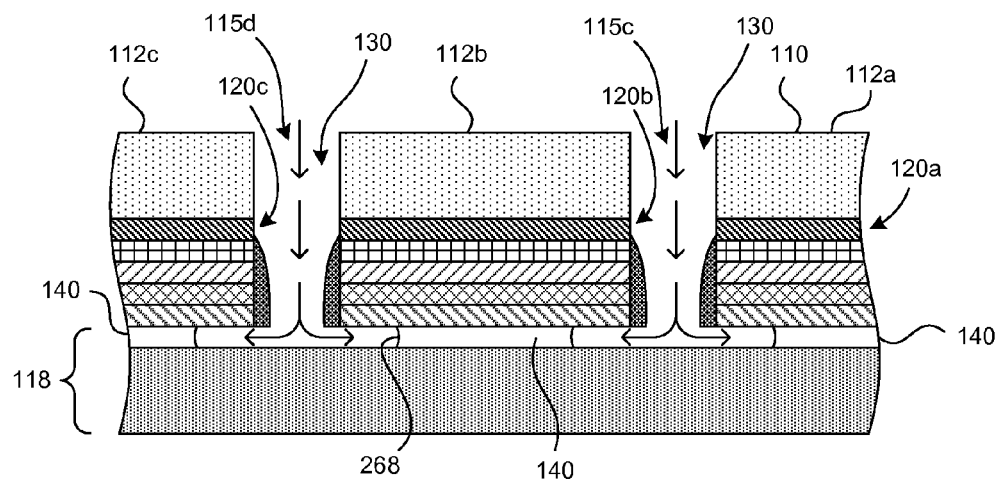

After forming the support member 110 with openings 115 (FIG. 1A), the individual transducers 120 can be separated from the growth substrate 118. FIG. 3F shows one embodiment of removing the transducers 120 from the growth substrate 118 using an etching media (represented by arrows) that removes at least a portion of the sacrificial material 140. The etching media (e.g., a liquid etchant, a vapor etchant, a gas etchant, etc.) can flow through the openings 115c, 115d such that it is generally uniformly distributed throughout the trenches 130. The etching media initially removes the portion of the sacrificial material 140 at the bottom of the trenches 130, and then the etching media underetches the transducers 120. FIG. 1A shows etched positions (illustrated in phantom line) of the sacrificial material at different times during the etching process. The entire peripheries of the transducers 120 can be underetched at the same time. Because the etching media can flow downwardly through the openings 115 and laterally under the transducers 120 from the sides of the transducers 120, the etching rates can be substantially uniform across the entire assembly 100 to simultaneously underetch substantially all of the transducers 120. The length of time to underetch the transducers 120 can be substantially less than the length of time to etch conventional wafer assemblies because the transducers 120 with widths W (see FIG. 3G) can be released from the base 142 when the sacrificial material 140 is laterally etched a length of W/2 from both sides of the respective transducers 120.

The composition and characteristics of the etching media can be selected based on desired etching rates and the type of etching process (e.g., wet etching, vapor etching, dry etching, etc.). The etching media can be a liquid (e.g., a liquid containing hydrofluoric acid, buffers, additives, etc.) suitable for wet etching. Alternatively, the etching media can be a vapor, such as vapor hydrofluoric acid or other vaporized acid. The etching media can selectively etch the sacrificial material 140 without etching the materials of the transducer elements 182 and/or the base 142. In some embodiments, the etching media can also etch a portion of the base 142 to increase the flow rate of the etching media underneath the transducers 182. Other types of etching media can be used to remove the sacrificial material 140 without damaging the transducer elements 182.

Figure 3G:
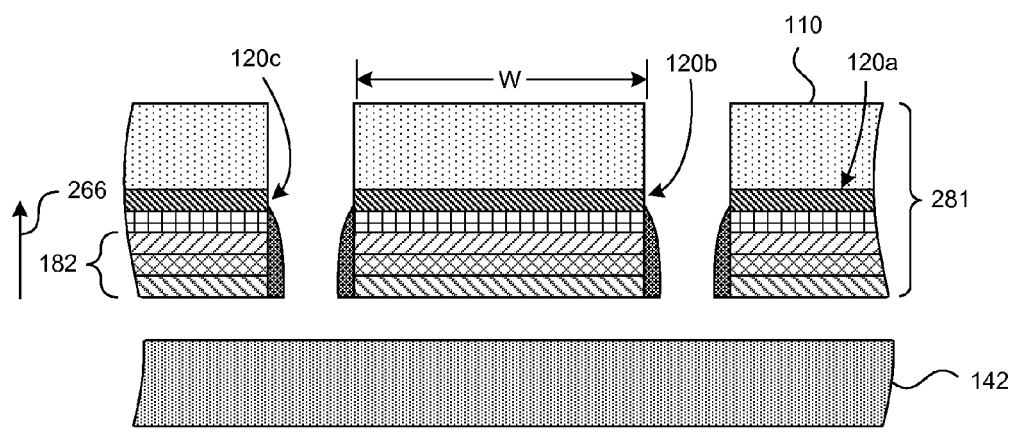

After removing the sacrificial material 140, the support member 110 can be used to lift the transducers 120 away from the base 142, as indicated by arrow 266 in FIG. 3G. The support member 110 can maintain the spacing between the transducers 120. The base 142 can be used in subsequent processes. For example, the base 142 can be used to grow additional structures (e.g., LEDs, transducers, etc.) to reduce fabrication costs. An assembly 281 of FIG. 3G can be singulated and additional features (e.g., contacts, wire bonds, pads, runners, or the like) can be formed to produce SSRT devices as discussed in connection with FIGS. 4 and 5.

Figure 4:
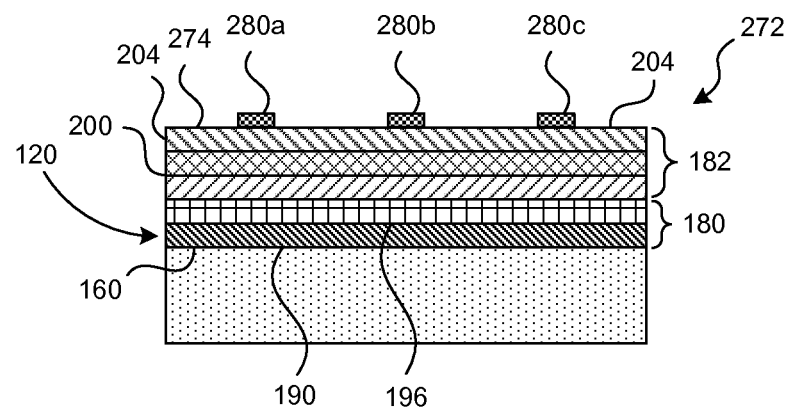
FIG. 4 is a schematic cross-sectional view of a solid state transducer device in accordance with an embodiment of the present technology.

FIG. 4 is a schematic cross-sectional view of an SSRT device 272 that can include the transducer 120 and a plurality of contacts 280a, 280b, 280c (collectively "280") formed on a surface 274 of the transducer 120. The contacts 280 are electrically coupled to the second semiconductor material 204, and the conducting material 196 can serve as a contact electrically coupled to the first semiconductor material 200. In several embodiments, the contacts 280 can be made, in whole or in part, of copper (Cu), aluminum (Al), silver (Ag), gold (Au), platinum (Pt), and/or other suitable electrically conductive materials. In other embodiments, the contacts 280 are transparent and made from indium tin oxide, aluminum zinc oxide, fluorine-doped tin oxide, and/or other substantially transparent and conductive materials.

Figure 5:
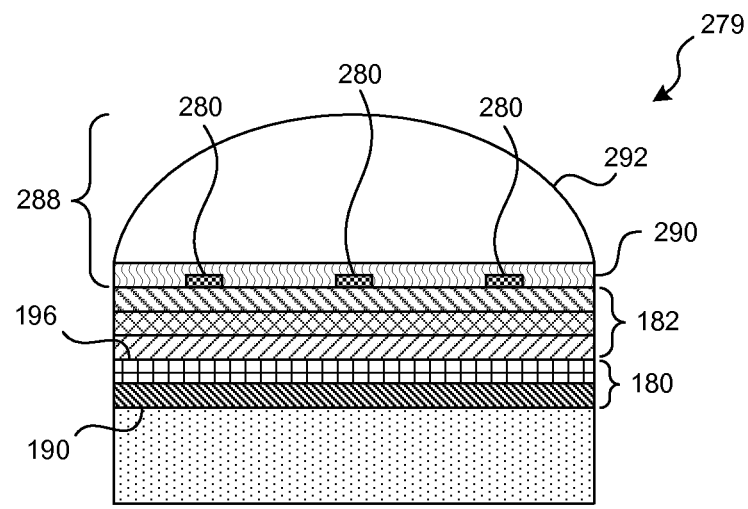
FIG. 5 is a schematic cross-sectional view of a solid state transducer device in accordance with an embodiment of the present technology.

FIG. 5 shows an SSRT device 279 that can include the transducer element 182, circuitry 180, contacts 280, and a converter structure 288. The converter structure 288 can include, without limitation, a converter element 290 and a cover 292. The converter element 290 can include phosphor, for example containing a doped yttrium aluminum garnet (YAG) (e.g., cerium (III) at a particular concentration for emitting a range of colors under photoluminescence. In other embodiments, the converter element 290 can include silicate phosphor, nitrate phosphor, aluminate phosphor, and/or other suitable wavelength conversion materials. The converter element 290 can have a generally square shape, as viewed from above, or other suitable shapes (e.g., oval, circular, etc). The cover 292 can be a lens configured to collimate, scatter, and/or otherwise diffract light or other emissions from the transducer element 182 and the converter element 290. In some embodiments, the SSRT device 279 can include a remote converter element and may not contain a lens structure or a cover.

Figure 6:
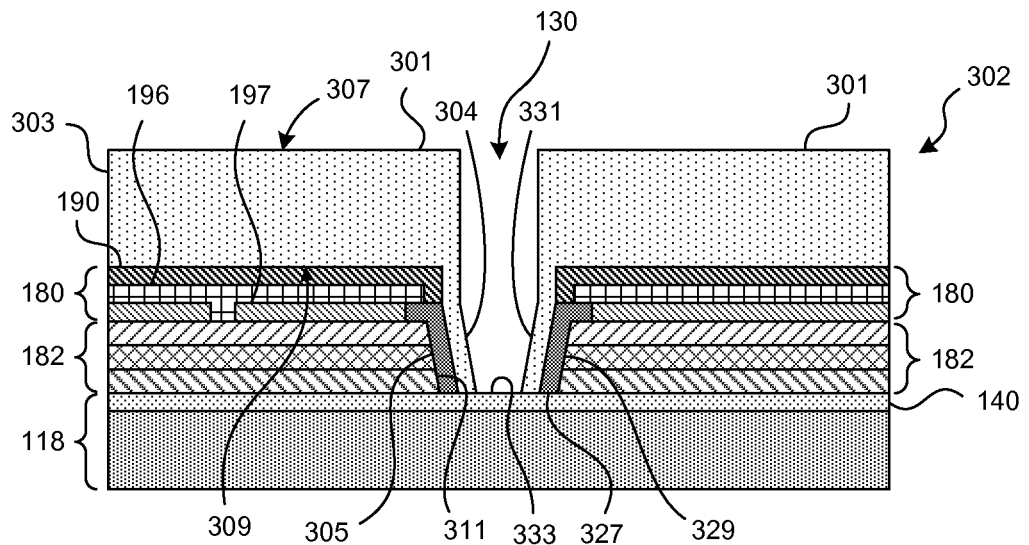
FIG. 6 is a schematic cross-sectional view of a solid state transducer device in accordance with an embodiment of the present technology.

FIG. 6 is a schematic cross-sectional view of an assembly 302 that is generally similar to the assembly 100 of FIGS. 1A-1C. However, the assembly 302 has pads 301 that can protect transducer elements 182 during etching. The assembly 302 further includes circuitry 180 that can include, without limitation, an insulating material 190, a conducting material 196, and an insulating material 197. The assembly 302 can include an insulating material 305 on a sidewall 311 of the transducer element 182. The pad 301 can include a sidewall covering 304 overlaying the insulating material 305. The assembly 302 can also include an insulating material 327 positioned on a second sidewall 329 of the transducer 182. A sidewall covering 331 overlays the insulating material 327 such that an exposed portion 333 of the sacrificial material 140 is positioned between the sidewall coverings 304, 331. The coverings 304, 331 can serve as a protective material to protect the transducer elements 182 from etching media. The assembly 302 can be singulated to make SSRT devices.

Figure 7A:
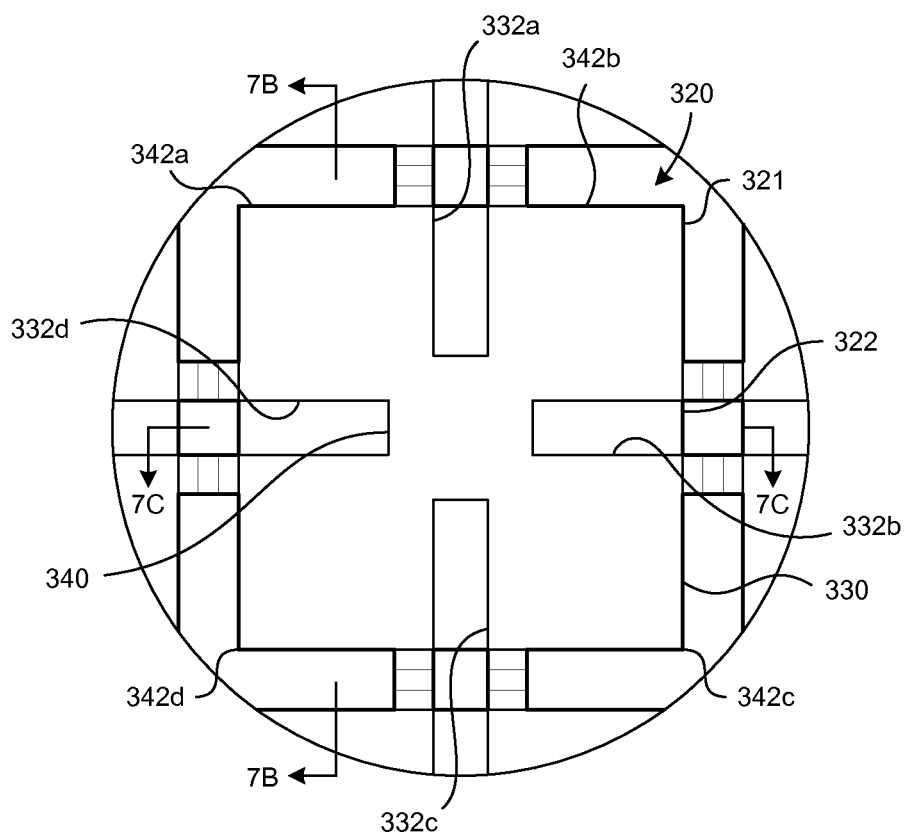
FIG. 7A is a schematic top plan view of a portion of a wafer-level assembly in accordance with an embodiment of the present technology.
Figure 7B:
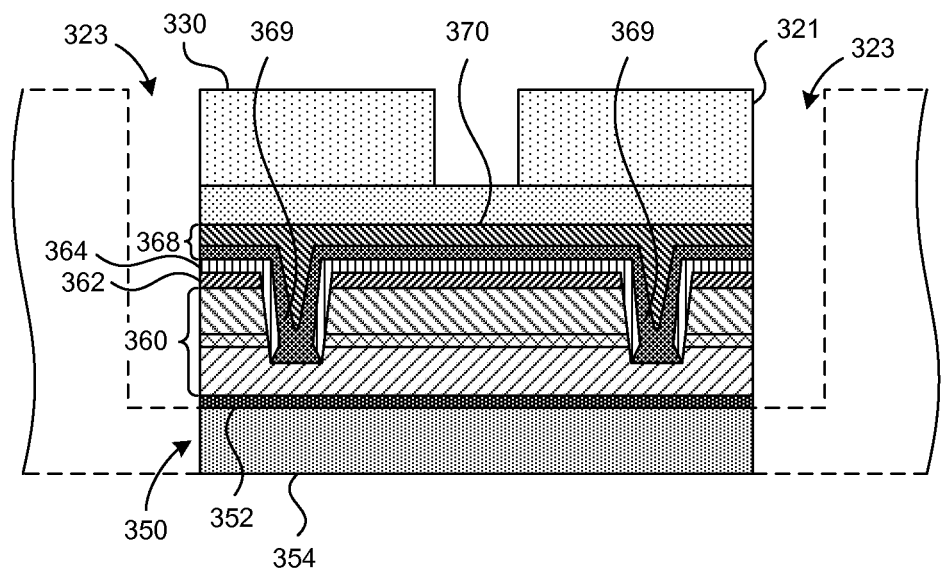
FIG. 7B is a schematic cross-sectional view of the wafer-level assembly taken along a line 7B-7B of FIG. 7A in accordance with an embodiment of the present technology.
Figure 7C:
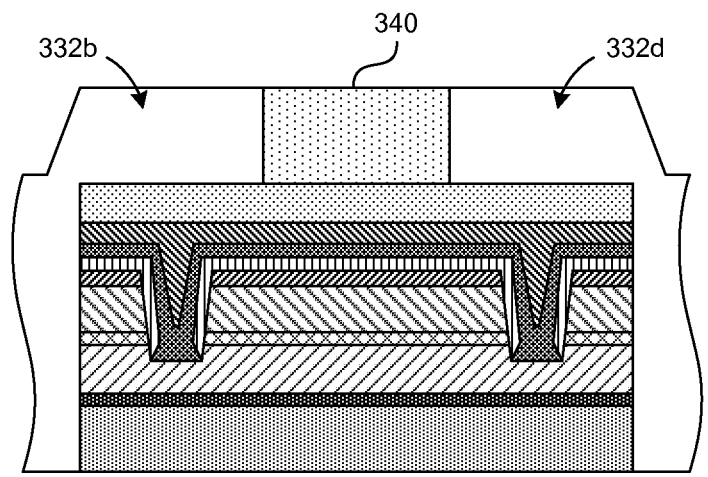
FIG. 7C is a schematic cross-sectional view of the wafer-level assembly taken along a line 7C-7C of FIG. 7A in accordance with an embodiment of the present technology.

FIGS. 7A-7C are schematic cross-sectional views of a wafer-level assembly 320 ("assembly 320") with buried contacts. The wafer assembly 320 can include a pad 321 including a main body 330 and a plurality of flow-through features 332a, 332b, 332c, 332d (collectively "332"). The flow-through features 332 can allow an etching media to flow along portions of the upper surface of a radiation structure 322 to conveniently access a sacrificial material. The illustrated embodiment has four flow-through features 332 but any number of flow-through features can be used. The flow-through features 332 can be trenches or channels that extend outward from a central region 340. Four corner regions 342a, 342b, 342c, 342d are connected to the central region 340 and define sidewalls of the flow-through features 332.

Figure 8:
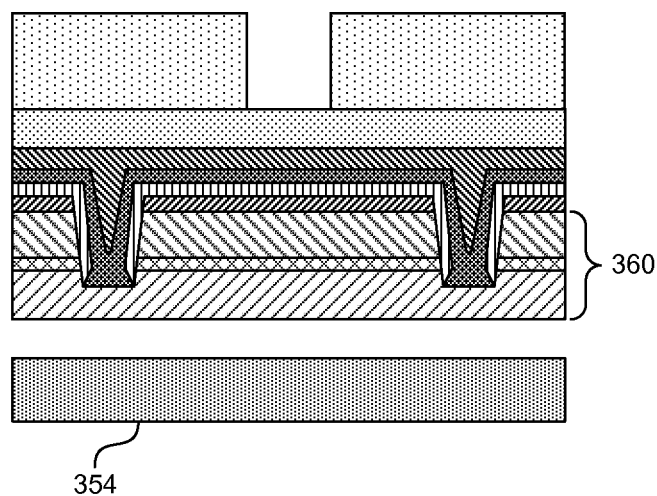
FIG. 8 is a schematic cross-sectional view of a solid state transducer spaced apart from a growth substrate in accordance with an embodiment of the present technology.

FIG. 7B shows a portion of the assembly 320 that includes a growth substrate 350 having a sacrificial material 352 and a base 354, a transducer element 360, a first contact 362, an insulating material 364, and a second contact 368. The second contact 368 can include buried contact elements 369 and a reflective portion 370. To separate the transducer element 360 from the base 354, an etching media can be delivered through the trenches 323. The etching media can spread uniformly throughout the network of trenches 323 to remove the sacrificial material 352. FIG. 8 shows the base 354 separated from the transducer element 360 after the sacrificial material 352 has been removed.

Figure 9A:
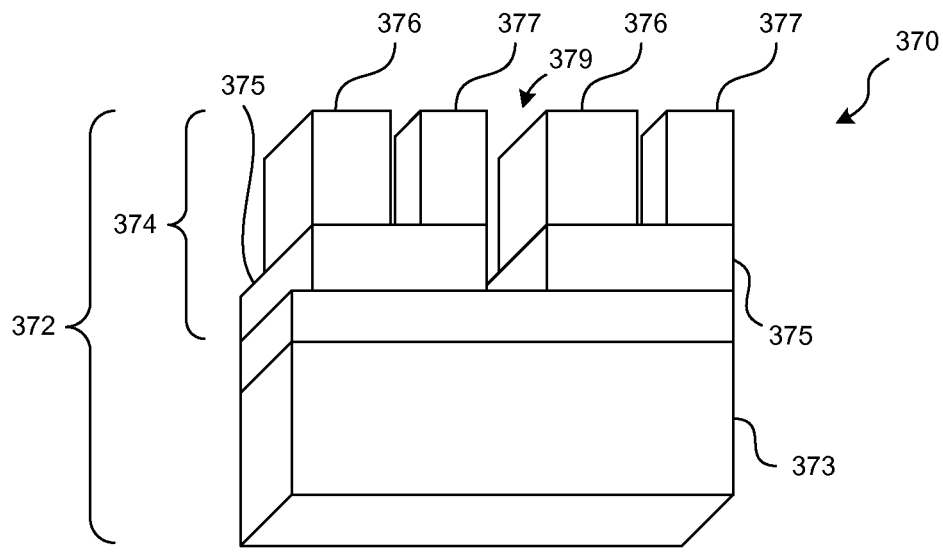
FIGS. 9A-9D are schematic views illustrating various stages in a method of manufacturing solid state transducers in accordance with an embodiment of the present technology.

FIGS. 9A-9D are schematic cross-sectional views illustrating various stages in a method of manufacturing solid state transducers in accordance with an embodiment of the present technology. Referring to FIG. 9A, a wafer level assembly 370 includes a transducer structure 372 that includes a growth substrate 373. The illustrated transducer structure 372 includes two solid state radiation transducers 374 separated by a trench 379. Each solid state radiation transducer 374 can include a transducer element 375, an anode 376, and a cathode 377.

Figure 9B:
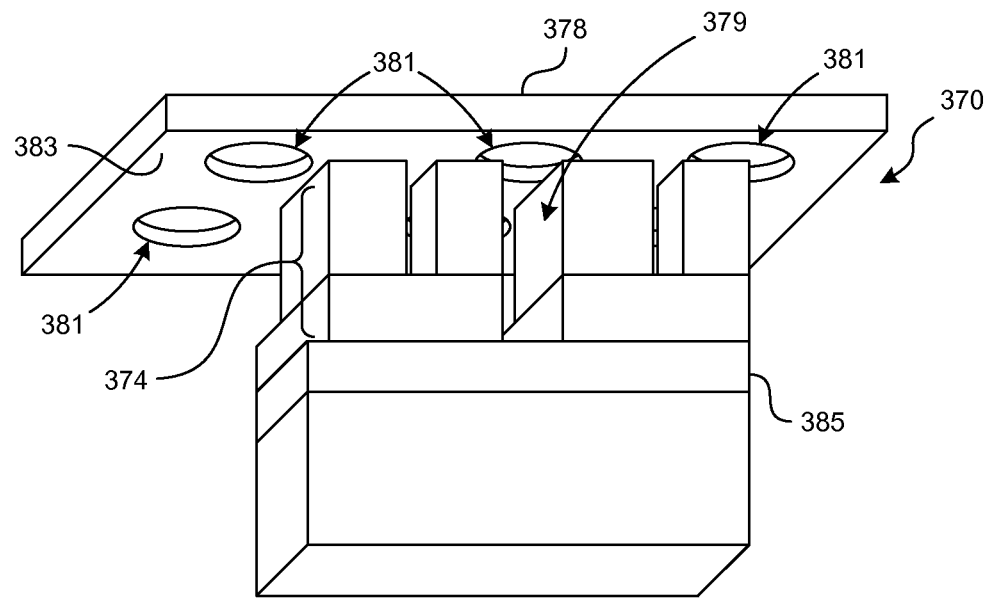

Referring to FIG. 9B, a transducer support member 378 is coupled to the two solid state radiation transducers 374. The transducer support member 378 can be porous such that fluid (e.g., etchant) flows into the trench 379 (FIG. 9A) positioned between the solid state radiation transducers 374. The transducer support member 378 can be in the form of a sheet (e.g., a metal sheet, a cloth sheet, etc.) or a strip (e.g., a strip of tape) made of a chemically resistant material and can include a plurality of openings 381. In some embodiments, the transducer support member 378 can have a bottom surface 383 comprising an adhesive (e.g., a chemically resistive adhesive, a bonding agent, or the like) for conveniently coupling to the solid state radiation transducers 374.

Figure 9C:
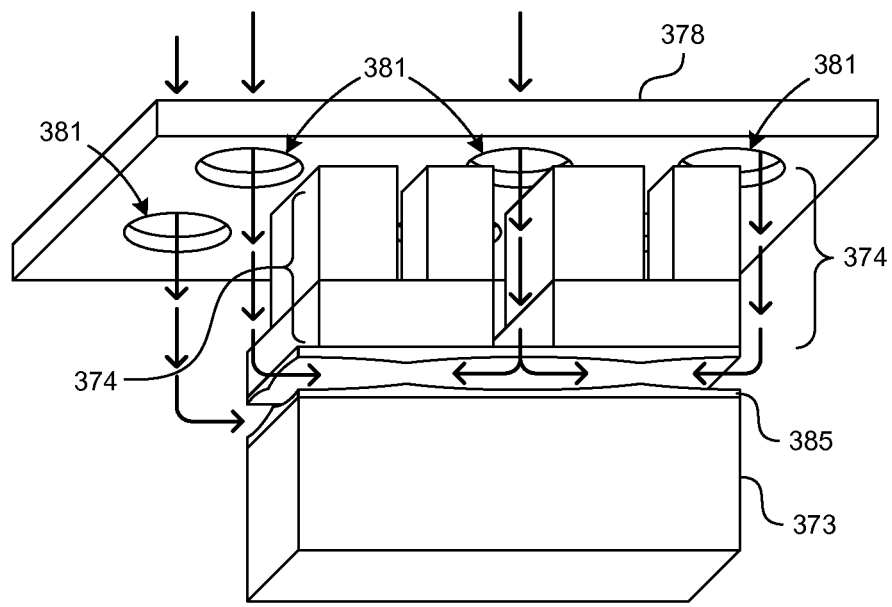
Figure 9D:
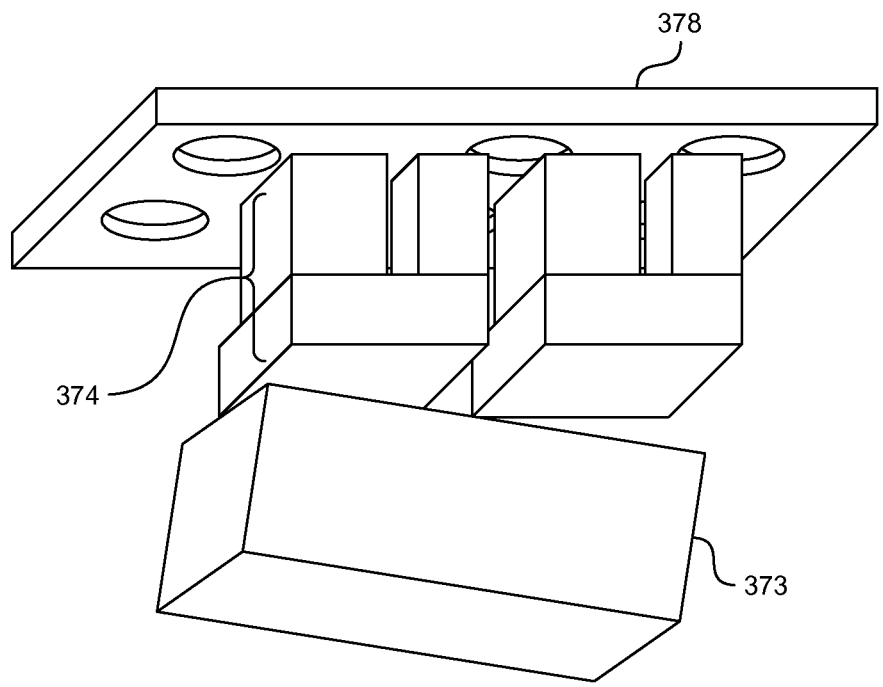

As shown in FIG. 9C, etchant can flow through the porous transducer support member 378 (e.g., via the openings 381) to remove a sacrificial material 385. The underetched solid state transducers 374 of FIG. 9C can be separated from the growth substrate 373. FIG. 9D shows the growth substrate 373 separated from the solid state transducers 374. The growth substrate 373 can be reused, and the solid state transducers 374 can be incorporated into SST devices.

Figure 10:
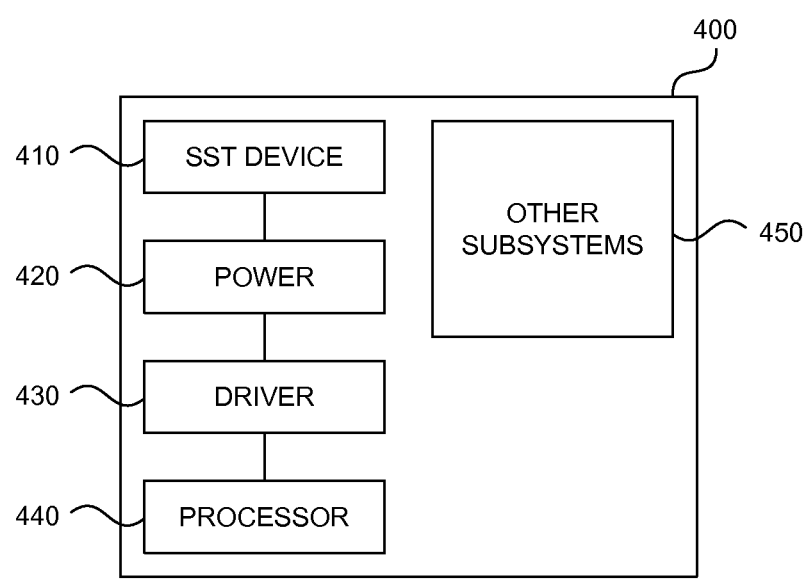
FIG. 10 is a schematic view of a solid state transducer system in accordance with an embodiment of the present technology.

Any one of the SST devices described above can be incorporated into any of a myriad of larger and/or more complex systems, a representative example of which is system 400 shown schematically in FIG. 10. The system 400 can include an SST device 410, a power source 420, a driver 430, a processor 440, and/or other subsystems or components 450. The resulting system 400 can perform any of a wide variety of functions, such as backlighting, general illumination, power generations, sensors, and/or other suitable functions. Accordingly, representative systems 400 can include, without limitation, hand-held devices (e.g., mobile phones, tablets, digital readers, and digital audio players), lasers, photovoltaic cells, remote controls, computers, and appliances. Components of the system 400 may be housed in a single unit or distributed over multiple, interconnected units (e.g., through a communications network). The components of the system 400 can also include local and/or remote memory storage devices, and any of a wide variety of computer readable media.

From the foregoing, it will be appreciated that specific embodiments of the invention have been described herein for purposes of illustration, but well-known structures and functions have not been shown or described in detail to avoid unnecessarily obscuring the description of at least some embodiments of the invention. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list.

From the foregoing, it will be appreciated that specific embodiments described above are for purposes of illustration and that various modifications may be made without deviating from embodiments of the invention. Aspects of the disclosure described in the context of particular embodiments may be combined or eliminated in other embodiments. Further, while advantages associated with certain embodiments of the disclosure may have been described in the context of those embodiments, other embodiments may also exhibit such advantages, but not all embodiments need necessarily exhibit such advantages to fall within the scope of the disclosure. For example, an etching media can be used to etch portions of transducers to release the transducers from a growth substrate. The processes disclosed herein can be used to form a wide range of different types of LEDs or other types of structures or chips. Additionally, transducer support members disclosed herein can be used to make different types of solid state transducers or chips. For example, the transducer support member 378 of FIGS. 9B-9D can be used to hold the solid state transducers 120 of FIGS. 3A-3G. Accordingly, the present invention is not limited to the embodiments described above, which were provided for ease of understanding, but rather the invention includes any and all other embodiments defined by the claims.

What is claimed is:

1. A method of forming a solid state transducer device, the method comprising:
    forming at least one trench through a semiconductor material, the trench forming a boundary between individual transducers; and
    delivering an etching media through the trench and underetching material at an interface between a growth substrate and the individual transducers such that the individual transducers are separated from the growth substrate.

2. The method of claim 1, further comprising holding the individual transducers using a transducer support member before delivering the etching media into the trench, and wherein the plurality of individual transducers are positioned between the transducer support member and the growth substrate while delivering the etching media into the trench.

3. The method of claim 1 wherein a sacrificial material is between the growth substrate and the individual transducers, and the method further comprises removing the sacrificial material using the etching media until the plurality of individual transducers are separated from the growth substrate.

4. The method of claim 3, further comprising removing at least a portion of a portion of the sacrificial material positioned directly between one of the individual transducers and a base of the growth substrate to separate the individual transducer from the growth substrate.

5. The method of claim 1, further comprising underetching substantially an entire periphery of at least one of the individual transducers at the same time.

6. The method of claim 1 wherein delivering the etching media includes delivering the etching media though a transducer support member extending across and holding the plurality of individual transducers.

7. The method of claim 6, further comprising forming pads of the transducer support member on the respective individual transducers and forming links of the transducer support member to couple the pads together.

8. The method of claim 7 wherein forming the links includes at least partially filling sections of the trenches such that the links extend across the trenches and between the pads.

9. The method of claim 6 wherein the transducer support member is an etch resistant transducer support member having openings through which the etching media flows to enter the trench.

10. The method of claim 1 wherein delivering the etching media includes delivering the etching media through a transducer support member extending across and coupled to the plurality of individual transducers via an adhesive.

11. The method of claim 10 wherein the transducer support member is porous and comprises an etch resistant material.

12. The method of claim 1 wherein forming the at least one trench includes forming a network of interconnected trenches extending across the growth substrate.

13. The method of claim 1, further comprising forming at least one of the individual transducers having a first semiconductor material, a second semiconductor material, and an active region between the first semiconductor material and the second semiconductor material.

14. The method of claim 13, further comprising:
   forming a first contact electrically coupled to the first semiconductor material; and
   forming a second contact electrically coupled to the second semiconductor material.

15. The method of claim 1 wherein at least one of the individual transducers is a light-emitting diode.

16. The method of claim 1, further comprising forming one or more protective materials on a sidewall of one the individual transducers before delivering the etching media through the trench.

17. The method of claim 16 wherein forming the one or more protective materials includes:
   forming an insulating material on the sidewall of the individual transducer; and
   forming a transducer support member such that a sidewall covering of the transducer support member overlays the insulating material.

18. A method of forming a light-emitting device (LED), the method comprising:
   forming a LED on a growth substrate, the LED comprising a first semiconductor material, a second semiconductor material, and an active region;
   forming at least one trench through the LED to a sacrificial material over the growth substrate and between individual transducers of the LED; and
   delivering an etching media through the trench to an interface between the individual transducers and the growth substrate.

19. The method of claim 18, further comprising removing a portion of the growth substrate contacting the individual transducers using the etching media.

20. The method of claim 18, further comprising forming a support member that physically couples the LEDs together before releasing the LEDs from the growth substrate.

21. The method of claim 20 wherein forming the support member includes forming pads on respective individual transducers and links connecting the pads together.

22. The method of claim 18, further comprising adhering a support member to the individual transducers before delivering the etching media, and delivering the etching media comprises passing the etching media through the support member and to the trench between the individual transducers.

23. The method of claim 18 wherein the individual transducers include a first transducer and a second transducer, the method further comprising:
   forming a first insulating material on a first sidewall of the first transducer;
   forming a first sidewall covering of the support member on the first insulating material;
   forming a second insulating material on a second sidewall of the second transducer; and
   forming a second sidewall covering of the support member on the second insulating layer such that an exposed portion of the growth substrate is positioned between the first sidewall covering and the second sidewall covering.

24. The method of claim 23 wherein at least one of the first sidewall covering and the second sidewall covering comprises an etch resistant material.

25. The method of claim 18, further comprising underetching substantially an entire length of a periphery of at least one of the individual transducers at the same time.

26. The method of claim 18, further comprising simultaneously underetching a plurality of the individual transducers.

27. The method of claim 18, further comprising separating the individual transducers from the growth substrate while an etch resistant support member holds the individual transducers.

28. A method of forming a solid state transducer, comprising:
   providing a growth substrate and a transducer structure on the growth substrate, the transducer structure having a first semiconductor material, a second semiconductor material, and an active region between the first and second semiconductor materials, the transducer structure including a plurality of individual transducers separated by at least one trench; and
   underetching between the growth substrate and the individual transducers from the trench between the individual transducers toward a center region of the individual transducers.

29. The method of claim 28 wherein the at least one trench surrounds most of a periphery of the individual transducers.

30. The method of claim 28, further comprising a support structure holding the individual transducers, the support structure including pads on the individual transducers and a plurality of links, wherein the plurality of links separate portions of the at least one trench and connect the pads together.

* * * * *